United States Patent
Boos

(10) Patent No.: US 7,242,251 B2
(45) Date of Patent: Jul. 10, 2007

(54) CONTROLLABLE AMPLIFIER CIRCUIT WITH A VARIABLE DISCRETE-VALUE GAIN, USE OF THE AMPLIFIER CIRCUIT AND METHOD FOR OPERATION OF AN AMPLIFIER WHOSE GAIN CAN BE ADJUSTED IN DISCRETE VALUES

(75) Inventor: Zdravko Boos, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/204,521

(22) Filed: Aug. 16, 2005

(65) Prior Publication Data

US 2006/0049875 A1    Mar. 9, 2006

(30) Foreign Application Priority Data

Aug. 17, 2004 (DE) ...................... 10 2004 039 830

(51) Int. Cl.
*H03G 3/10* (2006.01)
(52) U.S. Cl. .................. 330/279; 330/254; 330/51; 330/124 R
(58) Field of Classification Search ............... 330/279, 330/254, 51, 124 R
See application file for complete search history.

(56) References Cited

U.S. PATENT DOCUMENTS

| 5,216,384 | A  | * | 6/1993  | Vanhecke  | 330/279 |
|-----------|----|---|---------|-----------|---------|
| 5,977,828 | A  | * | 11/1999 | Hu et al. | 330/254 |
| 6,377,121 | B1 | * | 4/2002  | Giduturi  | 330/253 |
| 6,864,746 | B2 | * | 3/2005  | Cheah et al. | 330/254 |
| 2005/0225390 | A1 | * | 10/2005 | Klein et al. | 330/254 |
| 2006/0022748 | A1 | * | 2/2006  | Udagawa   | 330/51  |

FOREIGN PATENT DOCUMENTS

| DE | 101 63 466 A1 | 7/2003 |
| GB | 2 091 054 A   | 7/1982 |

* cited by examiner

*Primary Examiner*—Patricia Nguyen
(74) *Attorney, Agent, or Firm*—Eschweiler & Associates, LLC

(57) ABSTRACT

An amplifier circuit is disclosed in which a first amplifier stage and at least one second amplifier stage are each arranged between a signal input and a signal output. These amplifier stages are designed with a first gain factor and with a switching input. The amplifier circuit also has a third amplifier stage with a second gain factor, which is arranged between the signal input and the signal output. A control circuit is coupled to each amplifier stage for gain adjustment. The control circuit has a first control block designed for single-ended signal processing, and a second control block designed for push-pull signal processing. It is designed to supply control signals from the first control block to the amplifier stage when the gain of the first and at least one second amplifier stage is varied, and to supply control signals from the second control block to all of the amplifier stages when the gain of the at least one third amplifier stage is varied.

18 Claims, 3 Drawing Sheets

CONTROLLABLE AMPLIFIER CIRCUIT WITH A VARIABLE DISCRETE-VALUE GAIN, USE OF THE AMPLIFIER CIRCUIT AND METHOD FOR OPERATION OF AN AMPLIFIER WHOSE GAIN CAN BE ADJUSTED IN DISCRETE VALUES

REFERENCE TO RELATED APPLICATIONS

This application claims the benefit of the priority date of German application DE 10 2004 039 830.5, filed on Aug. 17, 2004, the contents of which are herein incorporated by reference in their entirety.

FIELD OF THE INVENTION

The invention relates to an amplifier circuit whose gain can be adjusted in discrete values, and to its use. The invention also relates to a method for operation of an amplifier whose gain can be adjusted in discrete values.

BACKGROUND OF THE INVENTION

The introduction of third-generation mobile radio systems requires very precise compliance with power levels of transmitted signals. For example, the UMTS/WCDMA mobile radio standard demands control of the emitted transmission power in order that the plurality of users who are transmitting in one frequency band do not excessively interfere with one another. The power control which is carried out both by the base stations and by the mobile stations is based on a "soft transition" between two different signal levels during a transmission or a reception process, thus avoiding interference signals in the process. There is therefore a fundamental requirement on the one hand to comply with the spectral requirements of the respective mobile radio standard, and on the other hand to reduce any phase or amplitude error in the transmitted signal.

A monitoring range of 80 dB is specified with an accuracy of 1 dB for the third-generation UMTS/WCDMA mobile radio standard and the CDMA2000 standard. Both pure voltage-controlled amplifiers and programmable amplifiers whose gain can be adjusted in discrete values can be used for these requirements.

In a programmable amplifier (PGC Programmable Gain controlled Amplifier), amplifier stages with a high gain are normally suitably combined with further amplifier stages with low gain. This makes it possible to cover a wide gain range with adequate resolution and accuracy at the same time. In order, by way of example, to cover the required range of 80 dB gain with an accuracy of 1 dB, it is known for a gain block to be provided in a programmable amplifier, in each case having five or six 1 dB stages and a second gain block with 13 6 dB gain stages.

When the gain in an amplifier such as this is changed to be a multiple of 6 dB, that is to say for example from 5 to 6 dB, the second gain block with the 6 dB steps is activated, and its gain is increased or reduced by 6 dB. At the same time, the overall gain of the first block is changed appropriately in the opposite direction in 1 dB stages.

By way of example, the first gain block with the 1 dB stages switches from a gain of +5 dB to a gain of 0 dB, while the second gain block changes its gain from 0 dB to +6 dB. The splitting of the programmable amplifier into two gain blocks with different resolution and different gain advantageously makes it possible to reduce the space consumed and the power.

On the other hand, FIG. 4A illustrates one frequent problem with a known programmable amplifier. In the example, the gain of 6 dB in the programmable amplifier is reduced to 5 dB. The gain of 6 dB means that the second amplifier block in the programmable amplifier is active with one amplifier stage, while the first amplifier block with the 1 dB amplifier stages is switched off. In order to make a reduction to 5 dB, the first block with its amplifier stages is now activated, and is used with full gain. At the same time, the second amplifier block is switched off.

This leads to an excessive signal level in the region of the transition of the gain from +6 dB to +5 dB, as is illustrated in FIG. 4A. Such an excessive signal level leads to an amplitude error and a phase error in the signal to be transmitted, and thus increases the bit error rate. Furthermore, downstream circuits can also be damaged by the high input value.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The invention is directed to a programmable amplifier which allows a smooth transition between two different gains, and prevents any excessive signal level. The invention also includes a method for operation of an amplifier whose gain can be adjusted in discrete values and which produces as little additional interference as possible.

With regard to one embodiment of the invention, an amplifier circuit comprises a first amplifier stage and at least one second amplifier stage. The two amplifier stages are in each case arranged such that they can be connected between a signal input and a signal output of the amplifier circuit. The amplifier stages are configured for amplification with a first gain factor and contain a switching input which is coupled to a control input for supplying a control signal for gain adjustment. The amplifier circuit furthermore contains at least one third amplifier stage, which is likewise arranged such that it can be connected between the signal input and the signal output. The third amplifier stage is configured to amplify signals applied to the input side with a second gain factor. A control circuit for gain adjustment, which is coupled to the switching inputs of the first, second and third amplifier stages and to the control input, is also configured for single-ended and push-pull signal processing. In particular, the control circuit is configured to supply switching signals and control signals to the amplifier stages, with the switching and control signals being derived from a single-ended signal for a switching process of the first and at least one second amplifier stage, or from a push-pull signal for a switching process for the at least one third amplifier stage.

Signal processing relating to gain variation is thus carried out both by means of single-ended signals and push-pull signals. In one embodiment of the amplifier circuit a first control block is configured for single-ended signal processing, and a second control block is configured for push-pull signal processing, allowing a soft transition between two different gain levels or gain factors during a switching process, or a change in the gain of the at least one third amplifier stage.

The push-pull signal processing prevents a signal to be transmitted being at an excessive level during a switching process of the at least one third amplifier stage with a concurrent switching process of the at least one first and second amplifier stage, since the switching signals which are derived from the push-pull signal for the amplifier stages have symmetrical characteristics and thus have little susceptibility to errors.

Particularly for switching processes which relate both to the at least one first and second amplifier stages and to the at least one third amplifier stage, it is expedient in one embodiment to configure the second control block for push-pull signal processing, and for production of control signals to all the amplifier stages.

In one embodiment of the invention, the amplifier stages are configured for push-pull signal processing with a differential amplifier. The amplifier circuit is thus configured to supply a difference signal on the input side. In another embodiment of the invention, the amplifier stages have a cascode circuit with a downstream differential amplifier. The input of the differential amplifier is coupled to the signal input of the amplifier circuit.

In another embodiment of the invention, a switchable current source, which has a controlled path, is provided to supply each amplifier stage. In this embodiment, the amplifier circuit according to the invention is in consequence formed from a series of parallel-connected individual amplifier stages. Some of these amplifier stages in this case have a first gain, while others have a second gain. Signal amplification in steps with discrete values is thus possible by adding or disconnecting the individual amplifier stages of the amplifier circuit according to the invention.

In one exemplary embodiment, five first and second amplifier stages each having a gain of 1 dB are provided, and at least one third amplifier stage with a gain factor of 6 dB is provided.

In another embodiment of the invention, the switching input of the at least one first, second and third amplifier stages contains a first switch, which is coupled to the control circuit and, in particular, to the first control block for supplying the switching signals. In addition, the switching input contains a second switch, which is coupled to the control device and in particular to the second control block for supplying a signal which is produced from the push-pull signal processing step.

The first and the second switch have a control input which is connected to the control circuit. In one embodiment, the second control block comprises a differential amplifier with a first and a second output. The first output is coupled to the first and at least one second amplifier stage, while the second output is coupled to the at least one third amplifier stage.

In a further embodiment, the at least one third amplifier stage is designed with a gain factor which corresponds to the gain factor of the at least one first and second amplifier stages multiplied by a number which is one greater than the total number of the at least one first and second amplifier stages. In this embodiment, a gain change is thus achieved in equal steps over the entire gain range.

With regard to the use of an amplifier circuit such as this, the invention comprises using the amplifier circuit in a transmitter for signals to be transmitted continuously. The amplifier circuit may be used for the amplification of a signal based on the UMTS/WCDMA or CDMA2000 mobile radio standard. It may be used in another advantageous manner for amplification of signals based on another communication standard which provides power monitoring of signals to be transmitted, during the transmission process.

With regard to the method for operation of an amplifier whose gain can be adjusted in discrete values. In the method an amplifier is provided which has at least two amplifier stages with a first gain and at least one third amplifier stage with a second gain. A signal to be amplified is applied thereto. Push-pull signals are then produced in order to adjust the amplifier stages for gain variation. These are supplied in derived form as switching and control signals to the individual amplifier stages, in order to adjust their gain. Once the gain stages have been adjusted with the aid of the push-pull signals, single-ended signals are produced which result in the amplifier stages within the adjustable amplifier having the same gain. These single-ended signals are supplied to the amplifier stages.

In consequence, when a transition which relates to the third amplifier stage is detected, push-pull signal processing is initiated, which produces push-pull signals which have the same state as the push-pull signals used for the amplification at that time. These push-pull signals are then processed further and may be supplied to the amplifier stages, with the single-ended signal processing being deactivated. A gain change by means of the push-pull signals is not carried out until this has been done. In consequence, a gain change is carried out using switching signals which are derived from push-pull signals or are produced by push-pull signal processing. Switching signals such as these have particularly low susceptibility to interference. Switching back to single-ended signal processing does not take place again until after the gain change has been made.

Push-pull signal processing and the supply of push-pull signals for gain variation are accordingly carried out whenever a gain change is made which relates to the third amplifier stage. This results in the control signals being matched extraordinarily well to the first and the third amplifier stage. This method can be used both in the baseband signal processing and in the radio-frequency processing in receivers and in transmitters.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

The invention will be explained in detail in the following text using one exemplary embodiment and with reference to the drawings, in which.

DETAILED DESCRIPTION OF THE INVENTION

Figure 1:
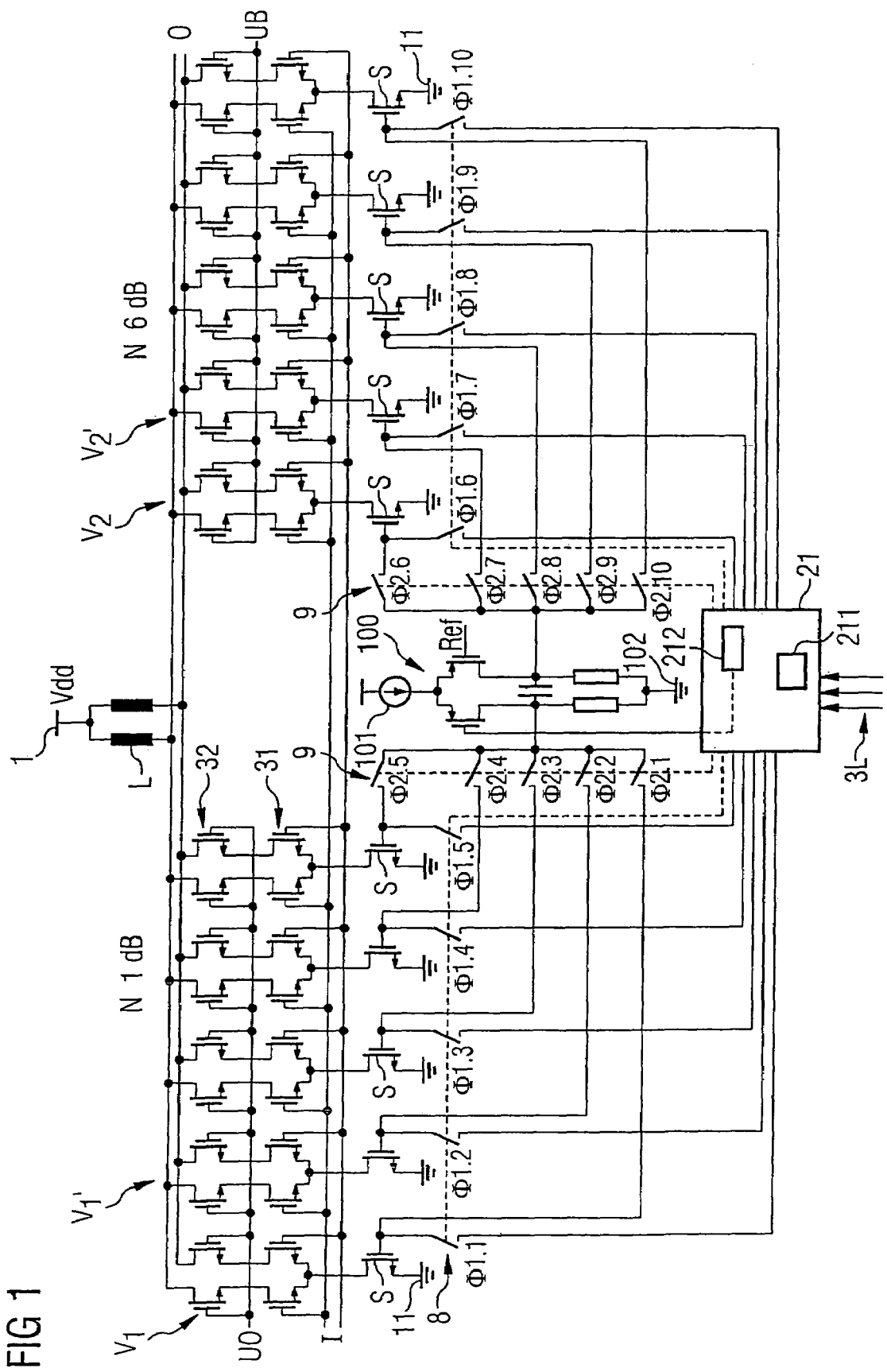
FIG. 1 is a schematic diagram illustrating one exemplary embodiment of an amplifier circuit according to the invention.

FIG. 1 shows an amplifier circuit as can be used, by way of example, in a programmable amplifier for the WCDMA/ UMTS mobile radio standard. The amplifier may be used not only in its own semiconductor body but also together with further components for the transmission path and the reception path in a transceiver chip. The amplifier has an input I and an output O, which are designed as difference signal inputs and difference signal outputs, respectively. Five amplifier stages are connected in parallel between the input I and the output O. Of these, the amplifier stages V1 and V1' are mentioned in particular for the rest of the description.

Each amplifier stage is designed with a differential amplifier stage 31, which is followed by a cascode circuit 32. The control inputs of the differential amplifier 31 are coupled to the input I. The control inputs of the two cascode transistors in the cascode circuit 32 are connected to a further input, to which an adjustment signal UB is supplied. The amplifier stages 31 in the amplifier V1 are connected to a supply potential $V_{dd}$ via two coils L, for supply purposes. Furthermore, they are coupled to a ground potential 11 via a field-effect transistor S, which acts as a current source. The amplifier stages V1 and V1' formed from field-effect transistors each have a gain of 1 dB. A signal applied to the input side is thus in each case amplified by 1 dB, and is emitted at the output O. Amplification takes place only when the transistor S is switched on.

The other five amplifier stages V2 are designed in the same way, and are likewise connected in parallel between the input I and the output O. They also have a differential amplifier stage as well as a downstream cascode circuit, whose drain connections are coupled to the supply potential $V_{dd}$ through the coils L, and whose source connections are coupled to the ground potential 11, via in each case one field-effect transistor S acting as a current source. However, one difference from the amplifier stages V1 is that the amplifier stages V2 and V2' are each designed for a gain of 6 dB. A signal applied on the input side is thus amplified by 6 dB per amplifier stage V2 and V2'. The different gain can be produced, for example, on the basis of different design of the amplifier stages in the two blocks.

The control connection of each transistor S is connected to a switch 8, in order to drive the respective field-effect transistors S, which act as a current source. The respective other connection of the switches leads to control and monitoring logic 21, which is supplied via a three-conductor bus with the control signal for gain adjustment of the overall arrangement. The control logic has a first control block 211. The control block 211 is designed for single-ended signal processing and for supplying switching signals to the individual amplifier stages.

Switches Φ1.1, Φ1.2, Φ1.3, Φ1.4 and Φ1.5 are provided in order to drive the gain stages V1, V1' and the further stages with a gain of 1 dB, one connection of which switches is connected to the control gate of the field-effect transistors S, with the other connection being connected to the control circuit 21. The switches are driven by the control circuit 21.

A respective switch Φ1.6 to Φ1.10 is also provided symmetrically with respect to this for the field-effect transistors S in the amplifier stages V2. The respective field-effect transistor S is thus switched on by closing and opening the respective switches Φ1.1 to Φ1.10, thus supplying current to the amplifier stage V1 or V2 associated with the transistors S. The transistors S thus form a switchable current source. Overall, the gain of the arrangement in the exemplary embodiment shown in FIG. 1 can be adjusted in 1 dB steps from 0 dB to 35 dB.

Furthermore, each control connection of the field-effect transistors S in the amplifier stages V1 and of the field-effect transistors S which act as a current source in the amplifier stage V2 is connected via a respective switch Φ2.1 to Φ2.10 to a differential amplifier 100. The differential amplifier 100 is connected between a current source 101 and a ground potential 102, and has two field-effect transistors, in which case a reference signal REF can be supplied to a control connection of one field-effect transistor, and the other field-effect transistor is connected by its control connection to the control and monitoring logic 21. The source connections of the two field-effect transistors in the differential amplifier 100 are connected to one another via a capacitor 104.

The switches Φ2.1 to Φ2.5 are connected by a tap to an output tap on the differential amplifier 100, and the switches Φ2.6 to Φ2.10 are connected to the second tap of the differential amplifier 100. The respective other connections of the switches Φ2.1 to Φ2.10 lead to the control connections of the field-effect transistors S in the amplifier stages V1 and V2. This arrangement means that the switches Φ2.1 to Φ2.10 are designed to supply switching signals to the field-effect transistors S, with these switching signals being derived from a push-pull signal. Together with the block 212, the differential amplifier 100 forms a second control block for push-pull signal processing. The signals which are supplied to the transistors and to the switches Φ2.1 to Φ2.10 are produced by the push-pull amplification of the differential amplifier 100. In contrast, the switches Φ1.1 to Φ1.10 are supplied with signals from the control logic in particular from the first control block 211, with these signals being derived from single-ended signals. Single-ended signal processing is thus carried out.

During operation of the amplifier stage according to the invention, some of the switches Φ1.x are closed, thus resulting in the amplifier circuit having a defined gain. By way of example, the switches Φ1.1 to Φ1.4 as well as the switch Φ1.6 are closed. The control and monitoring circuit 21 emits a switching signal to the control connections of the transistors S in the amplifier stages V1 and V2, so that this now results in a total overall gain of +10 dB. This is composed of a gain of +6 dB from the first amplifier stage V2, and a gain of +1 dB from each of four amplifier stages V1.

If it is now intended to increase the gain by 1 dB to +11 dB, then the control and monitoring logic closes the switch Φ1.5 via its control connection, so that an appropriate control signal is applied to the field-effect transistor S. In consequence, the amplifier stage which is connected to that field-effect transistor is supplied with the necessary supply voltage, and is then activated. The gain of the overall amplifier circuit is now +11 dB.

Figure 4A:
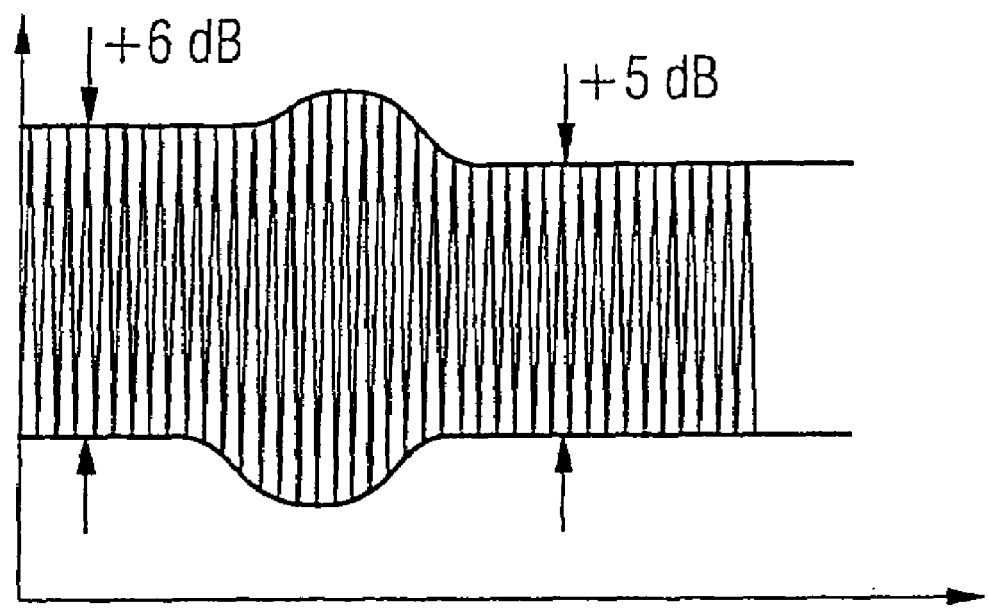
FIG. 4A is a time/power diagram of a signal during a gain transition according to the prior art.

If it is intended to increase the gain by a further dB, that is to say to 12 dB, then this means that a further amplifier stage with a gain of 6 dB must now be connected. If the switch Φ1.7 were now simply closed with the switches Φ1.1 to Φ1.5 being opened at the same time, this would lead to the excessive output signal level that is illustrated in prior art FIG. 4A, since the control circuit is processing single-ended signals which are neither symmetrical nor synchronous. In particular, attention must be paid to synchronicity, in order that this does not lead to a sudden drop or rise in the output level. Selectively switching to push-pull signal processing takes place in order to prevent this.

This is done by applying a signal at the control output 211 of the control and monitoring circuit 21 to the differential amplifier 100 in order to produce, at the output of the differential amplifier, a signal which corresponds to the signals supplied to the switches $\Phi 1.1$ to $\Phi 1.5$ and to the control connections of the field-effect transistors S in the amplifier stages. The push-pull logic is thus forced into the same state as the single-ended logic.

The advantage of the push-pull signal processing which is now carried out is that the switching off of the field-effect transistors S in the amplifier stages V1 and the connection of the additional amplifier stage V2 take place at the same time and in precisely the opposite direction in each case. An increase in a signal at an output tap of the differential amplifier leads to a corresponding identical reduction at the other tap. In other words, the switching-off signals and the connection signals are simultaneous and symmetrical, thus preventing any excess levels or overshooting during the transition.

Once the same signals are applied to the connections of the switches $\Phi 2.1$ to $\Phi 2.6$ as to the connections of the switches $\Phi 1.1$ to $\Phi 1.6$, the monitoring logic 21 closes the switches $\Phi 2.1$ to $\Phi 2.5$. The switch $\Phi 2.6$ is also closed at the same time. Once the switches have been closed, the single-ended logic with the switches $\Phi 1.1$ to $\Phi 1.6$ can be deactivated, and the switches $\Phi 1.1$ to $\Phi 1.6$ are opened. The field-effect transistors S in the amplifier stages V1 and V2 are now driven by a push-pull signal, but the state and the gain of the arrangement are still unchanged.

For the actual switching process, the switch $\Phi 2.7$ is now closed, and the switches $\Phi 2.1$ to $\Phi 2.5$ are opened at the same time. The transition takes place at the same time, with the drive being synchronous because of the difference signal that is used. After the switching process, the same control signals are applied to the connections of the switches $\Phi 1.6$ and $\Phi 1.7$, and they are closed in a next step. Finally, the switches $\Phi 2.6$ and $\Phi 2.7$ are opened again, and the push-pull signal processing is deactivated. Any further gain change or gain increase now takes place using single-ended signal processing again.

Figure 4B:
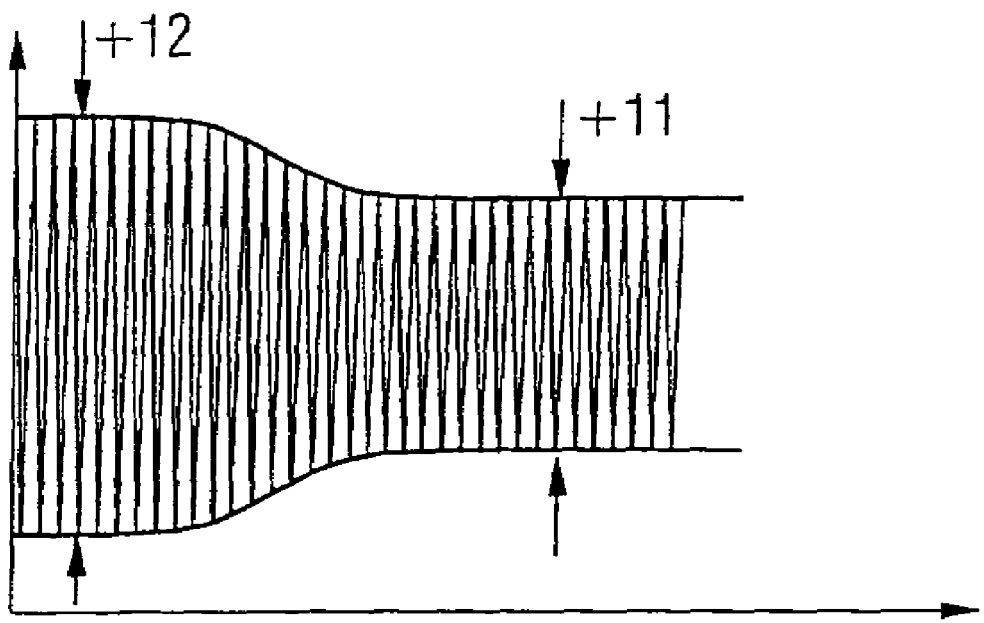
FIG. 4B is a time/power diagram of a signal during a gain transition in the amplifier circuit according to the present invention.

The push-pull signal processing according to the invention is thus carried out whenever an amplifier stage V2 is added or taken away. The transition when the gain is reduced in accordance with the present invention, for example, from 12 dB to 11 dB is shown in FIG. 4B. The transition in this case is smooth, without any additional overshooting.

Figure 3:
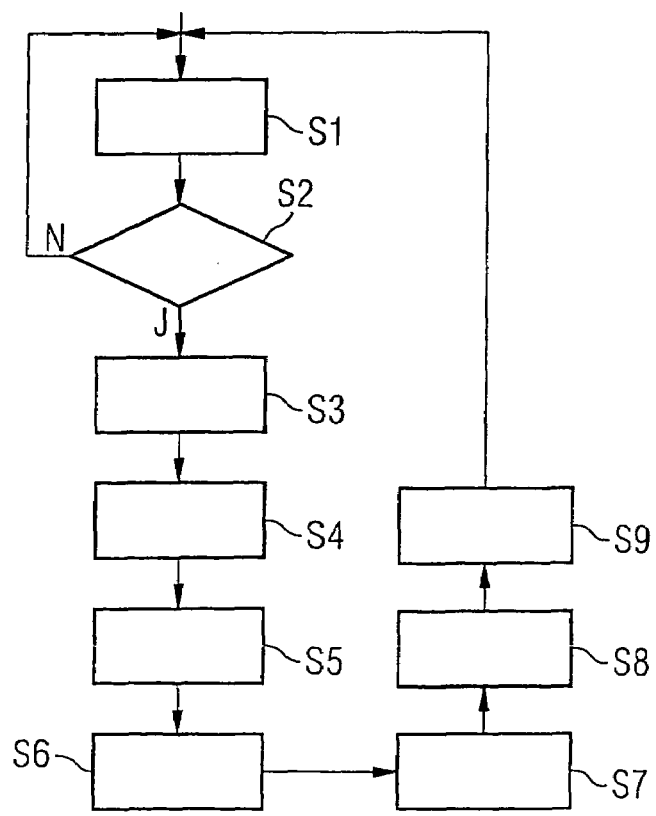
FIG. 3 is a flow chart diagram illustrating a method according to one exemplary embodiment of the invention.

FIG. 3 shows an exemplary embodiment of the method according to the invention. This is used in particular in an amplifier which has a plurality of gain stages with different gain. In this case, as in the exemplary embodiment, this may be an amplifier with gain stages which have two different gains. In addition, however, the method according to the invention can also make it possible to use other amplifiers whose individual gain stages likewise have a different gain response. An amplifier with amplifier stages which contain binary gain factors may be quoted as one example of this.

While the method according to the invention is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention.

After detection of a gain change at S1, a check is carried out at S2 to determine whether the gain change includes an amplifier stage with a second gain factor being activated or switched off. If this is not the case, only one amplifier stage with one first gain factor is added or taken away. This can still be done by supplying a single-ended signal. No switching to push-pull signal processing takes place.

However, if the gain change means that an additional amplifier stage with the second gain must be added or taken away, then the push-pull signal processing at S3 is activated. For example, the logic for the push-pull signal processing in the control and monitoring logic is supplied with the necessary voltage, and the appropriate signals are supplied. At S4, the state of the push-pull logic and the state of the circuits which process the push-pull signal are matched to the state of the single-ended logic. In other words, push-pull signals are now produced which have the same state as the single-ended signal, and are used for controlling the individual amplifier stages.

This is necessary in order to use the push-pull signals for controlling the individual amplifier stages for the control circuits at S4. When the push-pull signals and single-ended signals now have the same state, undesirable interference in the gain and/or in the output signals are/is reduced. At the same time, the control signals derived from the single-ended and push-pull signal processing can be substituted for each other, so that the logic which processes the single-ended signal can be deactivated at S5. The rest of the control process is now carried out using push-pull logic, and the necessary gain change is carried out at S6 with the aid of push-pull signals.

In the exemplary embodiment shown in FIG. 1, this is carried out by opening or closing the switches $\Phi 2.1$ to $\Phi 2.10$ in accordance with the requirements. The single-ended logic for driving the switches $\Phi 1.1$ to $\Phi 1.10$ is on the other hand switched off, and the switches $\Phi 1.1$ to $\Phi 1.10$ are opened.

The single-ended logic is activated again at S7, and is matched to the state of the push-pull logic at S8. The switching and control signals which are derived or produced by the single-ended logic now once again have the same state as the switching signals for the push-pull signal processing. In particular, on the basis of the change to the amplifier stage, an additional signal is now added or a single-ended signal is removed. The push-pull logic is switched off again at S9.

Figure 2:
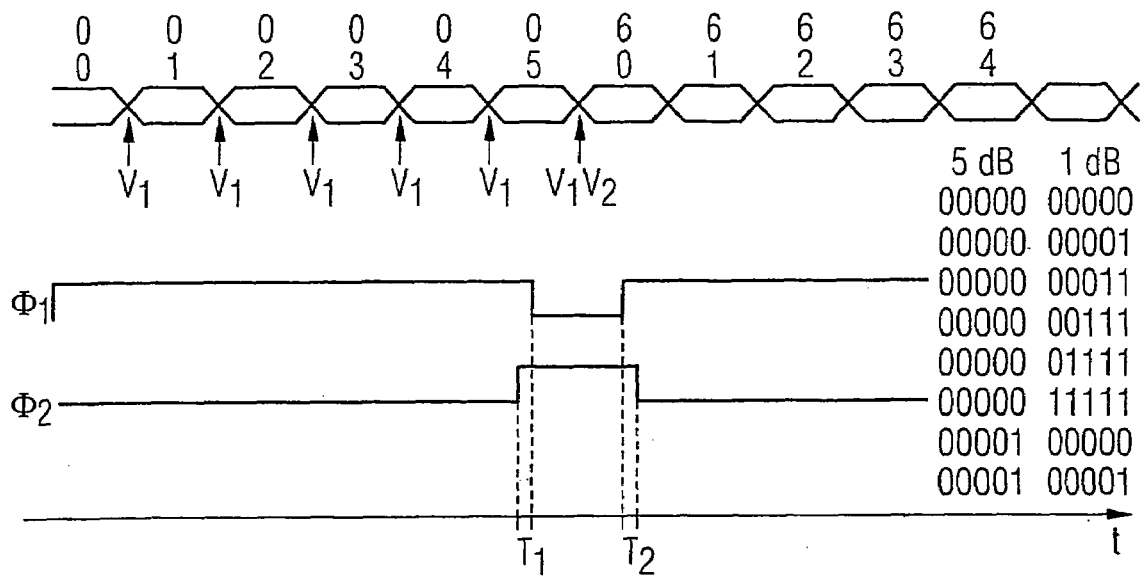
FIG. 2 is a time/signal diagram for a number of signals in the amplifier circuit according to the invention.

FIG. 2 shows the timing for a gain increase and the associated signals $\Phi 1$ and $\Phi 2$ for the switches $\Phi 1.x$ and $\Phi 2.x$. In this example, the gain is increased by a total of 10 dB. Amplifier stages V1 are added in each of the first five steps, thus resulting in a gain of +5 dB at the end. This is done using pure single-ended logic. For an increase to +6 dB, all the amplifier stages V1 must be deactivated, and one amplifier stage V2 with a gain of +6 dB must be activated. This is done by activating the control signals $\Phi 2$ for the switches $\Phi 2.x$ shortly before the switching takes place. The push-pull signal processing is activated. During the short time period T1, the state of the logic which processes the push-pull signal is matched to the state of the logic which processes the single-ended signal. The push-pull and single-ended signals emitted from the control and monitoring circuit then have the same state. The logic which processes the single-ended signal can now be switched off at the end of the time interval T1.

This is indicated in the exemplary embodiment by the signals $\Phi 1$ for the switches $\Phi 1.1$ to $\Phi 1.5$ falling to a low logic level. The amplifier stage V2 is then activated, and the amplifier stages V1 are deactivated. The logic which processes the single-ended signal is activated again at the start of the time period T2, and the state of the single-ended control signals is matched to the state of the push-pull signals. At the end of the time period T2, the control signals once again have the same state. The logic which processes the push-pull signal is deactivated again.

In the exemplary embodiment described here, the amplifier circuit according to the invention uses field-effect transistors. In this case NMOS and PMOS field-effect transistors or else a combination of both types may be used. In an alternative refinement, the individual amplifier stages V1 to V2 are designed using bipolar transistors. Other current sources can also be used in addition to the field-effect transistors which act as a current source S. The switches Φ1.1 to Φ1.10 as well as Φ2.1 to Φ2.10 may likewise be formed by field-effect transistors or other type switching devices or circuits.

The overall arrangement can be implemented in a simple manner using CMOS technology or pure NMOS or PMOS technology in one semiconductor body. Logic components, for example AND gates, may be used to detect and identify whether an amplifier circuit V2 must be added or taken away. The control circuit 21 thus switches from single-ended signal processing to push-pull signal processing when this is necessary for the gain change. The push-pull signal processing reduces the crosstalk on a signal during switching of the gain, in contrast to single-ended signal processing. This is possible since push-pull signal processing is relatively independent of and insensitive to changes in the temperature, the supply voltage or process scatters. A binary decoder table is used to decode the individual gain positions in this case, as illustrated in FIG. 2. The content of a decoder table depends on the amplifier stages which are used. It is thus possible to produce amplifiers with gain factors which have a binary weighting with respect to one another. Instead of this, it is likewise possible to use pure software, a microcontroller or a fixed switching table.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The invention claimed is:

1. A controllable amplifier circuit configured to adjust a gain thereof in discrete values, comprising:
    a signal input configured to receive an input signal;
    a signal output configured to output an amplified signal based on a gain of the amplifier circuit;
    a control input configured to receive a control signal indicative of a desired gain of the amplifier circuit;
    a control circuit configured to vary the gain of the amplifier circuit based on a state of the control signal;
    a first amplifier stage and at least one second amplifier stage each arranged between the signal input and the signal output, and each comprising a first gain and a switching input for selective activation thereof coupled to the control circuit; and
    at least one third amplifier stage arranged between the signal input and the signal output, and comprising a second gain and a switching input for selective activation thereof coupled to the control circuit,
    wherein the control circuit comprises a first control block configured to provide single-ended signal processing, and a second control block configured to provide push-pull signal processing, and further configured to supply control signals from the first control block to the first and at least one second amplifier stage for a gain change in the first and at least one second amplifier stage, and configured to supply control signals from the second control block to the first and at least one second and at least one third amplifier stage for a gain change in the at least one third amplifier stage.

2. The controllable amplifier circuit of claim 1, wherein the first and at least one second amplifier stage and the at least one third amplifier stage are configured to provide push-pull signal amplification with a differential amplifier.

3. The controllable amplifier circuit of claim 1, wherein at least one of the first and at least one second and at least one third amplifier stage comprises a cascode circuit with a downstream differential amplifier coupled thereto, the differential amplifier comprising an input coupled to the signal input.

4. The controllable amplifier circuit of claim 1, further comprising a switchable current source comprising a controlled path individually associated with each of the first amplifier stage, the at least one second amplifier stage, and the at least one third amplifier stage, and configured to selectively supply current for the first amplifier stage, the at least one second amplifier stage, and the at least one third amplifier stage baaed on switching control signals from the control circuit.

5. The controllable amplifier circuit of claim 1, wherein the second control block comprises a differential amplifier with a first and a second output, with the first output coupled to the first and at least one second amplifier stage, and the second output coupled to the at least one third amplifier stage.

6. The controllable amplifier circuit of claim 1, further comprising a first switch and a second switch connected to the switching input of the first amplifier stage, the at least one second amplifier stage, and the at least one third amplifier stage, wherein the first switch is coupled to the control circuit that is configured to supply the switching signal of the first control block, and wherein the second switch is coupled to the control device that is configured to supply the switching signal of the second control block.

7. The controllable amplifier circuit of claim 6, wherein the first and the second switch comprise a control input connected to the control circuit.

8. The controllable amplifier circuit of claim 1, wherein the at least one third amplifier stage is configured with a gain that is equal to the gain of the first and at least one second amplifier stage multiplied by a number which is 1 greater than a total number of the at least one first and second amplifier stages.

9. The controllable amplifier circuit of claim 1, wherein a total of five first and second amplifier stages are provided, each having a gain of 1 dB, and the gain of the at least one third amplifier stage is 6 dB.

10. The controllable amplifier circuit of claim 1, wherein the control input of the amplifier circuit coupled to the control circuit comprises a 3-conductor bus.

11. A controllable amplifier circuit, comprising:
a signal input, a signal output, and a control input;
a control circuit configured to selectively vary a gain of the amplifier circuit based on a state of the control input; and
at least two first amplifier stages arranged in parallel and connected in the signal path between the signal input and the signal output, and at least one second amplifier stage connected in the signal path between the signal input and the signal output, and
wherein the first and second amplifier stages are coupled to the control circuit,
wherein the control circuit is configured to produce a push-pull control signal for switching the at least one second amplifier stage for a switching process thereof, and configured to produce a single-ended control signal, after the switching process, for driving the at least two first and the at least one second amplifier stages thereafter.

12. The amplifier circuit of claim 11, wherein a gain of the first and second amplifier stages is the same, and further comprising at least one third amplifier stage coupled between the input and the output, and comprising a gain that is greater than the gain of the first and second amplifier stages.

13. The amplifier circuit of claim 12, wherein the control circuit is configured to produce the push-pull control signal when activating or deactivating the at least one third amplifier stage.

14. The amplifier circuit of claim 13, further comprising a switching network coupled to the first, second and third amplifier stages, wherein the switching network is configured, in accordance with switching control signals fro the control circuit, to establish a switching configuration for the push-pull control signal prior to decoupling the single-ended control signal from the first, second and third amplifier stages.

15. The amplifier circuit of claim 14, wherein the switching network is further configured to establish a switching configuration for the single-ended control signal prior to decoupling the push-pull control signal from the first, second and third amplifier stages.

16. A method for operation of an amplifier having a gain adjustable in discrete values, comprising:
providing an amplifier circuit comprising first and second amplifier stages with a first gain and at least one third amplifier stage with a second gain different that the first gain;
applying a signal to be amplified to the amplifier circuit;
producing push-pull signals for selective adjustment of the amplifier stages to alter a gain of the amplifier circuit;
adjusting an operation of the amplifier stages by means of switching and control signals derived from the push-pull signals;
producing single-ended signals for the changed gain;
supplying to the amplifier stages switching and control signals derived from the single-ended signals; and
amplifying an applied signal with the changed gain.

17. The method of claim 16, wherein producing the push-pull signals comprises:
producing push-pull signals which cause the same gain as the single-ended signals;
concurrently supplying the switching and control signals derived from the single-ended signals and push-pull signals to the amplifier stages; and
switching off the switching and control signals derived from the single-ended signals.

18. The method of claim 16, further comprising:
detecting a signal that indicates a gain change; and
producing push-pull signals for adjustment of the amplifier stages when the gain change dictates a change in operation of at least one third amplifier stage.

* * * * *

UNITED STATES PATENT AND TRADEMARK OFFICE
CERTIFICATE OF CORRECTION

| | | |
|---|---|---|
| PATENT NO. | : 7,242,251 B2 | Page 1 of 1 |
| APPLICATION NO. | : 11/204521 | |
| DATED | : July 10, 2007 | |
| INVENTOR(S) | : Zdravko Boos | |

It is certified that error appears in the above-identified patent and that said Letters Patent is hereby corrected as shown below:

Column 10, line 38, claim 4: Please replace the word "baaed" with the word --based--.

Column 11, line 36, claim 14: Please replace the word "fro" with the word --from--.

Signed and Sealed this

Twenty-first Day of August, 2007

JON W. DUDAS
*Director of the United States Patent and Trademark Office*